United States Patent [19]

Kokubu

[11] Patent Number: 4,829,192
[45] Date of Patent: May 9, 1989

[54] PHOTO-COUPLER WITH DELAY FUNCTION USING A FLUORESCENT SUBSTANCE AS THE DELAY MEANS

[75] Inventor: Sadao Kokubu, Aichi, Japan

[73] Assignee: Kabushiki Kaisha Tokai Rika Denki Seisakusho, Japan

[21] Appl. No.: 31,245

[22] Filed: Mar. 26, 1987

[30] Foreign Application Priority Data

Mar. 27, 1986 [JP] Japan ................................. 61-69867
Mar. 28, 1986 [JP] Japan ............................. 61-45782[U]

[51] Int. Cl.$^4$ .......................... G02B 27/00; F21V 9/16
[52] U.S. Cl. .................................. 250/551; 250/458.1; 357/19
[58] Field of Search ................. 250/551, 458.1, 461.1, 250/327.2 F; 307/311; 357/19

[56] References Cited

FOREIGN PATENT DOCUMENTS 1267751 11/1986 Japan ........................... 250/327.2 F Primary Examiner—David C. Nelms
Assistant Examiner—Stephone B. Allen
Attorney, Agent, or Firm—Steele, Gould & Fried

[57] ABSTRACT

A photo-coupler with delay function includes a fluorescent substance, a light-emitting diode disposed at one end of the fluorescent substance and a phototransistor disposed at the other end of the fluorescent substance. While a light emitted from the light-emitting diode is impinging on the fluorescent substance, it emits a fluorescence. The fluorescent substance emits a phosphorescence after an emission from the light-emitting diode is interrupted. In this arrangement, when the fluorescent substance is displaced with an operating plate, the light intermittently emitted from the light-emitting diode impinges on the fluorescent substance. The phototransistor selectively detects the light intermittently emitted from the light-emitting diode, the fluorescence and the phosphorescence both continuously emitted from the fluorescent substance.

5 Claims, 3 Drawing Sheets

PHOTO-COUPLER WITH DELAY FUNCTION USING A FLUORESCENT SUBSTANCE AS THE DELAY MEANS

BACKGROUND OF THE INVENTION

1. Field of the Invention

This invention relates generally to photo-couplers wherein input electrical signals are optically coupled to an output, and more particularly to the photo-coupler with delay function wherein generation of output signals is delayed relative to the input signals.

2. Description of the Prior Art

The photo-coupler is a composite device wherein the input signals are coupled to the output with input and output terminals, that is, front and rear portions of a circuit electrically insulated. The photo-coupler has an advantage in protection of the circuit from electrical noises, so that the photo-coupler has been used in wide fields of application.

Where the photo-coupler is provided with a delay function, the output signals are, conventionally, delayed by means of an integrator circuit or the like.

Such an expensive delay circuit as the integrator circuit is thus required when the delay function is applied between the input and output signals in the case of the photo-coupler. Accordingly, provision of the expensive delay circuit complicates the circuit arrangement and increases the production cost of the photo-coupler.

SUMMARY OF THE INVENTION

Therefore, a primary object of the present invention is to obtain the delay function between the input and output signals in the photo-coupler without employing the expensive electrical delay circuit.

A second object of the invention is to provide a photo-coupling switch device wherein a light is intermittently emitted from a light source.

To attain the primary object of the invention, the photo-coupler with delay function comprises a light source, a fluorescent substance and a light detector. When input signals are supplied to the light source, it emits a light, which impinges on the flourescent substance. While the light emitted from the light source is impinging on the fluorescent substance, it emits a fluorescence, which is detected by the light detector. The limit detector then supplies output signals. When the supply of input signals is interrupted, the light source stops emitting the light. After the emission of the light source is interrupted, the fluorescent substance emits a phosphorescence the intensity of which gradually decreases. The light source maintains the output signals above a predetermined threshold while an amount of the phosphorescence maintains above a predetermined level, thereby providing a delay time between the input and output signals.

To attain the second object of the invention, the photo-coupling switch device comprises an operating plate, a fluorescent substance, a light guiding member, a light source and a light detector. The fluorescent substance is selectively placed at one of two positions. When placed at one of the positions, the fluorescent substance is opposed to the light guiding member. The light source is adapted to intermittently emit the light. The light source and the light detector are provided in the vicinity of the light guiding member so that the light intermittently emitted from the light source is detected by the light detector through the light guiding member.

According to the above-described embodiment, the light intermittently emitted from the light source impinges on the light detector when the fluorescent substance is unopposed to the light guiding member. While, in the case where the fluorescent substance is opposed to the light guiding member, the fluorescence continuously emitted from the fluorescent substance impinges on the light detector. Switch signals are thus obtained by changing manners of the light impinging on the light source between the intermittently emitted light and the continuously emitted light.

Other and further objects of the invention will become obvious upon an understanding of the illustrative embodiments about to be described or will be indicated in the appended claims, and various advantages not referred to herein will occur to one skilled in the art upon employment of the invention in practice.

DESCRIPTION OF THE PREFERRED EMBODIMENTS

Figure 1:
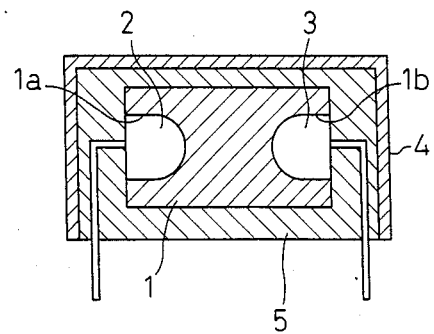
FIG. 1 is a longitudinal section of the photo-coupler with delay function in accordance with a first embodiment of the invention.
Figure 2:
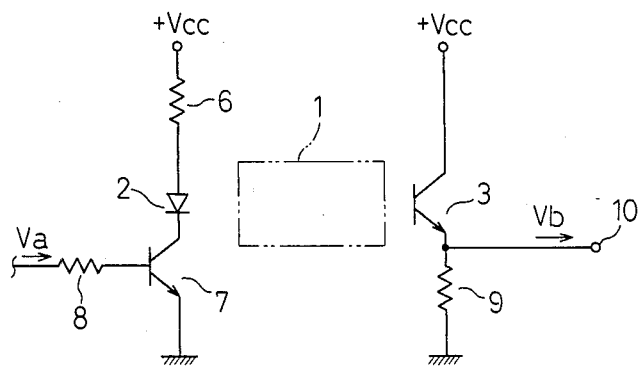
FIG. 2 is a diagrammatic view of an electrical circuit in which the photo-coupler in FIG. 1 is incorporated.
Figure 3A:
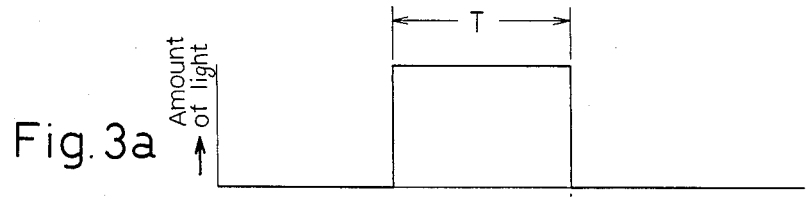
FIGS. 3a and 3b show relations between an impinging light and an electrical output in the circuit shown in FIG. 2 respectively.

Five embodiments will now be described with reference to the drawings. There is shown in FIGS. 1, 2 and 3a a photo-coupler of a first embodiment. Referring to FIG. 1, a fluorescent substance 1 is formed into a rectangular block configuration and has two recess portions 1a and 1b formed in opposed end surfaces respectively. The fluorescent substance 1 fluoresces while a light is impinging on it. After the light ceases impinging on it, the fluorescent substance 1 emits a phosphorescence the intensity of which gradually decreases. A light-emitting diode 2 as a light source and a phototransistor 3 as a light detector are provided within the recess portions 1a and 1b respectively so as to be opposed to each other. A light emitted from the light-emitting diode 2 impinges on the fluorescent substance 1, which fluoresces. The fluorescence emitted from the fluorescent substance 1 is detected by the phototransistor 3. The fluorescent substance 1, the light-emitting diode 2 and the phototransistor 3 are enclosed in a case 4. A molded member 5 as a means for shielding the components enclosed in the case 4 against outside light is provided within the case 4. The fluorescent substance 1, the light-emitting diode 2 and the phototransistor 3 are fixed with the molded member 5 in the case 4. A silicone rubber is applied to the molded member 5 so that the molded member 5 has a light shielding effect.

FIG. 2 shows an electrical circuit wherein the above-described photo-coupler is incorporated.

An anode of the light-emitting diode 2 is connected to a power-supply terminal +Vcc through a resistance 6. A cathode of the light-emitting diode 2 is connected to a collector of an NPN transistor 7. An emitter of the NPN transistor 7 is grounded. The NPN transistor 7 is turned on when an input voltage Va is supplied to a base thereof through a resistance 8. A collector of the phototransistor 3 is connected to a power-supply terminal +V'cc and an emitter of the phototransistor 3 is grounded through a resistance 9. An output voltage Vb is obtained at an output terminal 10 connected to the emitter of the phototransistor 3 in accordance with an amount of light detected by the phototransistor 3.

Figure 3B:
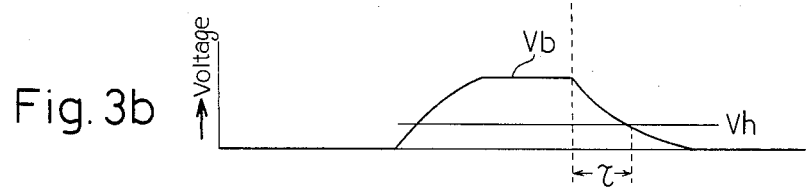

According to the above-described circuit arrangement, when the input voltage Va having a pulse length T is supplied to the base of the NPN transistor 7, the NPN transistor 7 is turned on and the light-emitting diode 2 emits a light the amount of which varies as shown in FIG. 3a. The light emitted from the light-emitting diode 2 impinges on the fluorescent substance 1, which fluoresces. After the emission of the light-emitting diode 2 is interrupted, the fluorescent substance 1 emits a phosphorescence. Accordingly, the phototransistor 3 maintains the on-state while an amount of the fluorescence and the phosphorescence both emitted from the fluorescent substance 1 is kept above a predetermined level. That is, an amount of the fluorescence and the phosphorescence detected by the phototransistor 3 or the level of output voltage Vb at the output terminal 10 varies as shown in FIG. 3b. The output voltage Vb is compared with a predetermined threshold Vh shown in FIG. 3b to thereby obtain an output voltage delayed by a period τ relative to the input voltage Va. In this case, since the fluorescent substance 1, the light-emitting diode 2 and the phototransistor 3 are shielded against the outside light by the molded member 5, the photo-coupler is effectively prevented from malfunction.

According to the photo-coupler of the first embodiment, a light detecting time period of the phototransistor 3 is delayed by making use of the fluorescent substance 1 in order that the input voltage Va may be delayed. Consequently, an expensive delay circuit is denecessitated, thereby providing cost reduction of the photo-coupler.

Although the light-emitting diode 2 and the phototransistor 3 are placed opposedly in the first embodiment, these may be placed in parallel and the fluorescent substance 1 may be opposed to the light-emitting diode 2 and the phototransistor 3.

Figure 4:
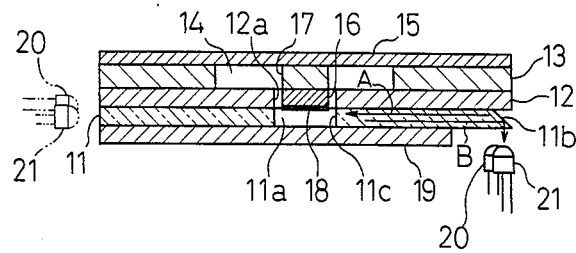
FIG. 4 is a longitudinal section of the photo-coupling switch device as a second embodiment.
Figure 5:
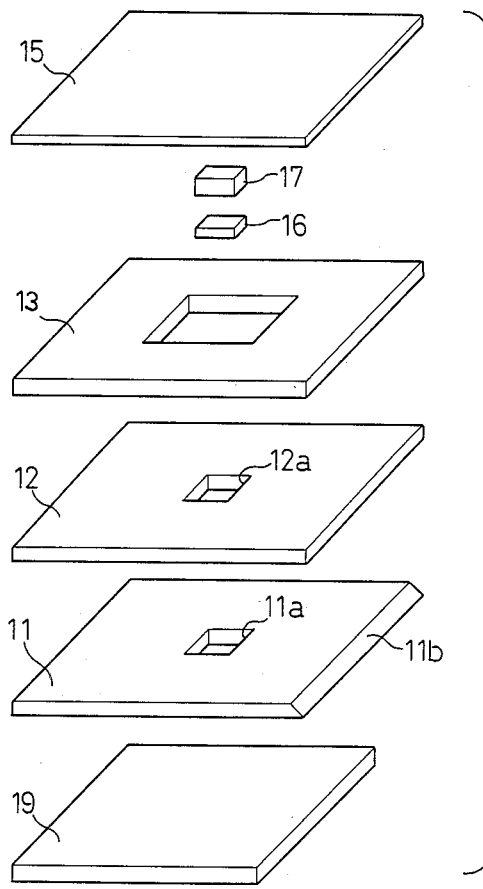
FIG. 5 is an exploded view of the switch device shown in FIG. 4.

FIGS. 4-7 show a second embodiment wherein the invention is applied to a photo-coupling switch device. Referring to FIGS. 4 and 5, numeral 11 indicates a light guiding member. The light guiding member 11 is formed of a transparent plastic plate and has a rectangular flat configuration. The light guiding member 11 has a central rectangular opening 11a. As shown in FIG. 4, a right-hand edge portion of the light guiding member 11 is cut at an angle of 45° to top and under surfaces thereof so as to serve as a reflecting surface 11b. A light shielding plate 12 is provided on the light guiding member 11 to shield the fluorescent substance 16 and the light guiding member 11. The light shielding plate 12 is formed of a plastic material having a light shielding effect and has the same rectangular flat configuration as the light guiding member 11. The light shielding plate 12 is provided with a central opening 12a having the same configuration as the opening 11a. A spacer 13 provided on the light shielding plate 12 is formed of a plastic material having a light shielding effect and has a rectangular frame-like configuration and the same outer configuration as the light shielding plate 12. Accordingly, a central space 14 communicates with the openings 11a and 12a. An operating plate 15 provided on the spacer 13 is formed of a plastic film with elasticity. The operating plate 15 has the same outer configuration as the spacer 13.

Figure 6:
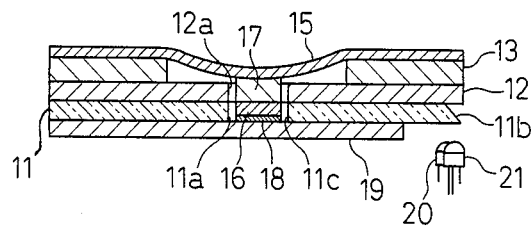
FIG. 6 is a view similar to FIG. 4 showing the switch device, wherein the operating plate is elastically deformed.

Numeral 16 indicates a fluorescent substance of a rectangular flat configuration. The fluorescent substance 16 fluoresces while the light is impinging thereon. After the light ceases impinging on the fluorescent substance 16, it emits the phosphorescence the intensity of which gradually decreases. The fluorescent substance 16 is mounted on a central under surface of the operating plate 15 with a support plate 17 inserted therebetween so that the fluorescent substance 16 is normally positioned within the opening 12a. In this position, an under surface of the fluorescent substance 16 is placed at least above a top surface of the light guiding member 11. Accordingly, the light emitted from the fluorescent substance 16 does not normally impinge on the light guiding member 11. A black paint is coated on or a film is applied to an under surface of the fluorescent substance 16 by means of adhesive or the like to thereby provide a light shielding layer 18. When a central top surface portion of the operating plate 15 is depressed with a finger or the like, the operating plate 15 suffers from elastic deformation as shown in FIG. 6. As the result of elastic deformation of the operating plate 15, the fluorescent substance 16 is displaced into the opening 11a and opposed to an inner peripheral surface 11c of the light guiding member 11. When the finger is released, the operating plate 15 returns to the normal state shown in FIG. 4. An under surface of the light guiding member except part opposed to the reflecting surface 11b is covered with a rectangular opaque reinforcement 19.

Figure 7A:
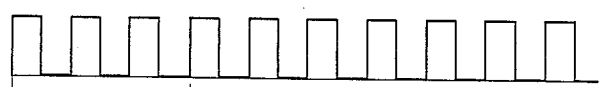
FIG. 7a shows output waveform of the light source employed in the switch device in FIG. 4.

A light-emitting diode 20 as a light source is placed below the reflecting surface 11b of the light guiding member 11 so as to be opposed to the reflecting surface 11b. In this case, the light emitted from the light-emitting diode 20 impinges on the reflecting surface 11b of the light guiding member 11 and reflected thereon in the direction of arrow A in FIG. 4 through the light guiding member 11. In this embodiment, pulse signals are supplied to the light-emitting diode 20 so that the light-emitting diode 20 intermittently emits the light. FIG. 7 shows an output waveform of the light-emitting diode 20. A phototransistor 21 is placed below the reflecting surface 11b in opposed relation thereto, that is, the phototransistor 21 is placed side by side with the light-emitting diode 20. As the result of the above-described arrangement, part of the light emitted from the light-emitting diode 20 and guided in the direction of arrow A through the light guiding member 11 is reflected on the inner peripheral surface 11c in the direction of arrow B and again reflected on the reflecting surface 11b to thereby impinge on the phototransistor 21.

Switching signals are generated when the output voltage of the phototransistor 21 is maintained at a level above a predetermined threshold Vh for a predetermined period of time T, for example, for a time period longer than a cycle of the light intermittently emitted from the light-emitting diode 20.

The light guiding member 11, the light shielding plate 12, the spacer 13, the operating plate 15 and the reinforcement 19 are fixed by means of adhesvie or for holding peripheral edges thereof.

According to the aboev-described arrangement, in normal condition, that is, when the operating plate 15 does not suffer from elastic deformation, the fluorescent substance 16 is not opposed to the inner peripheral surface 11c of the light guiding member 11. Consequently, since the light emitted from the fluorescent substance 16 does not impinge on the phototransistor 21, the output of the phototransistor 21 shows an intermittent waveform Vc such as that in the period t1 or t3 of FIG. 7c in accordance with the light emitting cycle of the light-emitting diode 20. In this case, the output voltage of the phototransistor 21 is not maintained at the level above the treshold Vh for the predetermined time period $T_1$ and the switching signals are not supplied.

Figure 7B:
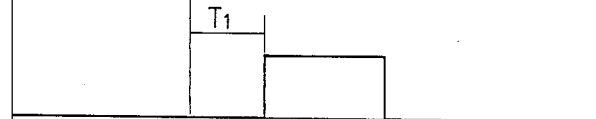
FIG. 7b shows waveform of a switch signal obtained in the switch device in FIG. 4.
Figure 7C:
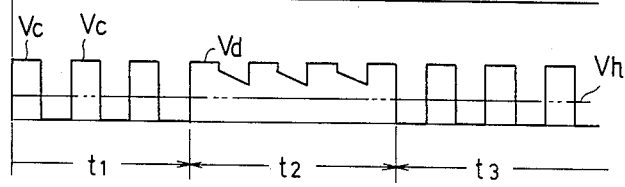
FIG. 7c shows output waveform of the light detector employed in the switch device in FIG. 4.

When the central top surface of the operating plate 15 is depressed, the fluorescent substance 16 is displaced to be opposed to the inner peripheral surface 11c of the light guiding member 11 as shown in FIG. 6. The light intermittently emitted from the light-emitting diode 20 impinges on the fluorescent substance 16 in a period of emission of the light-emitting diode 20, whereby the fluorescent substance 16 fluoresces. After the emission of the light-emitting diode 20 is interrupted, the fluorescent substance 16 emits the phosphorescence the intensity of which decreases gradually. The phosphorescence is guided through the light guiding member 11 and reflected on the reflecting surface 11b to be detected by the phototransistor 21. Accordingly, in a period t2 during which the central top surface of the operating plate 15 is being depressed, the output of the phototransistor 21 presents a voltage waveform Vd, which level is maintained above the threshold Vh even after the emission from the light-emitting diode 20 is interrupted. See a period t2 in FIG. 7. Consequently, since the period during which the output of the phototransistor 21 is maintained at the level above the threshold Vh continues for more than the predetermined period $T_1$, a switching signal shown in FIG. 7b is generated. That is, when the central top surface of the operating plate 15 is depressed for more than the predetermined period $T_1$, the switching signal is generated. The output of the switching signal is interrupted when the operating plate is returned to the normal state shown in FIG. 4.

Generally, where the photo-coupling switch device is comprised of a light source, a light detector and a manually operated shutter closing and opening a light passageway provided between the light source and the light detector, the electric power would be supplied to the light source intermittently, not continuously, for the saving of the electric power consumed. In this case, however, a detector circuit for detecting the light intermittently emitted from the light source requires a means, such as a delay circuit, for discriminating a no light detection by the light detector due to the operation of the shutter from the no light detection by the light detector due to a no light emitting period of the light source which intermittently emits the light. Consequently, the production cost of the photo-coupling switch device is increased.

However, in the photo-coupling switch device of the above-described second embodiment, although the light intermittently emitted from the light-emitting diode 20 is normally detected by the phototransistor 21, the phosphorescence continuously emitted from the fluorescent substance 16 is detected by the phototransistor 21 when the operating plate 15 corresponding to the shutter is depressed. Consequently, an expensive delay circuit is denecessitated in the photo-coupling switch device of the second embodiment. Furthermore, since the electric power is supplied to the light-emitting diode 20 so that the light is intermittently emitted therefrom, an amount of the electric power consumed is reduced as compared with prior art photo-coupling switches. Additionally, each of the light guide member 11, the light shielding plate 12, the spacer 13, the operating plate 15 and the reinforcement 19 is formed into a simple configuration and produced at relatively low cost. These members are stacked one upon another, so that the photo-coupling switch device of the second embodiment has a simple construction and the production cost thereof is decreased. Since the movable portion of the switch device also has as simple arrangement, the switch device is rendered small-sized and thinner as compared with the prior art photo-coupling devices.

Although the light guiding member 11 has the reflecting surface 11b, it may be eliminated. For example, the reflecting surface 11b is denecessitated where the light-emitting diode 20 and the phototransistor 21 are placed as shown by alternate long and two shrt dashes line in FIG. 4.

Although the fluorescent substance 16 is displaced when the operating plate 15 is depressed, the light guiding member 11 may be displaced toward the fluorescent substance 16.

Figure 8:
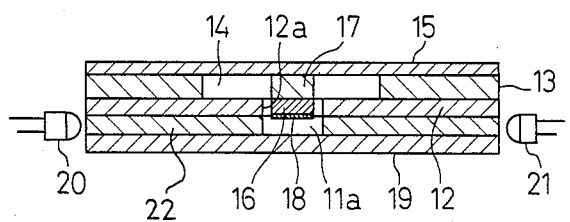
FIG. 8 is a view similar to FIG. 4 showing the photo-coupling switch device as a third embodiment.

FIG. 8 shows a photo-coupling switch device of a third embodiment. Identical parts are labelled by the same reference numerals as those in FIG. 4. A marginal portion of the light guiding member 11 is cut perpendicularly. The light-emitting diode 20 is provided in the vicinity of one of two end portions of the light guiding member 11 so that the light emitted from the light-emitting diode 20 is guided through the light guiding member 11. The phototransistor 21 is provided in the vicinity of the other end portion of the light guiding member 11 so that the light emitted from the light-emitting diode 20 is detected by the phototransistor 21 through the light guiding member 22. The above-described arrangement provides the same effect as that in the second embodiment.

Figure 9:
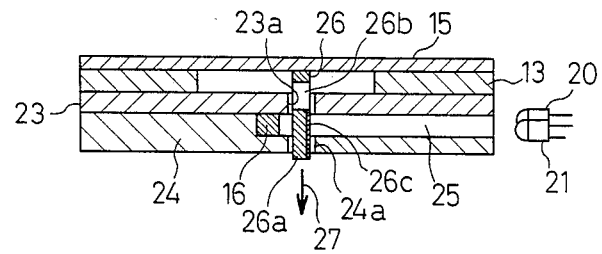
FIG. 9 is a view similar to FIG. 4 showing the photo-coupling switch device as a fourth embodiment.

FIG. 9 shows a fourth embodiment of the invention. Identical parts are labelled by the same reference numerals as those in the second embodiment. A space defined by two light shielding plates 23 and 24 serves as a light passageway 25. The light-emitting diode 20 and the phototransistor 21 are provided in the vicinity of an outer end portion of the light passageway 25 so that the light emitted from the light-emitting diode 20 is guided through the light passageway 25 and that the light guided through the light passageway 25 is detected by the phototransistor 21. The fluorescent substance 16 is provided at an inner end of the light passageway 25. A movable member 26 provided on the under surface of the operating plate 15 extends through slits 23a and 24a formed in the light shielding plates 23 and 24 respectively. The movable member 26 includes a shutter portion 26a and an opening 26b. When the operating plate 15 is not depressed, the shutter portion 26a of the movable member 26 is positioned within the light passageway 25 and the opening 26b is positioned outside the light passageway 25. A reflecting member 26c is provided on the surface of the shutter portion 26a opposed to the outer end of the light passageway 25.

In operation of the device of the fourth embodiment, when the operating plate 15 is not depressed, the light intermittently emitted from the light-emitting diode 20 is guided through the light passageway 25 to be reflected on the reflecting member 26c provided on the shutter portion 26a and detected by the phototransistor 21. See FIG. 9. When the operating plate 15 is depressed, the movable member 26 is moved in the direction of arrow 27. With the movement of the movable member 26, the shutter portion 26a is moved outside the light passageway 25 and the opening 26b is moved into the light passageway 25. The light intermittently emitted from the light-emitting diode 20 passes through the opening 26a of the movable member 26 to thereby impinge on the fluorescent substance 16. Then, the fluorescent substance 16 continuously emits the fluorescence, which passes through the light passageway 25 to be detected by the phototransistor 21. Afterward, when the operating plate 15 is returned to the normal state, the light intermittently emitted from the light-emitting diode 20 is detected by the phototransistor 21 instead of the fluorescence continuously emitted from the fluorescent substance 16. Switching signals are thus obtained by changing the light detected by the phototransistor 21 between the light intermittently emitted from the light-emitting diode 20 and the fluorescence continuously emitted from the fluorescent substance 16.

Figure 10:
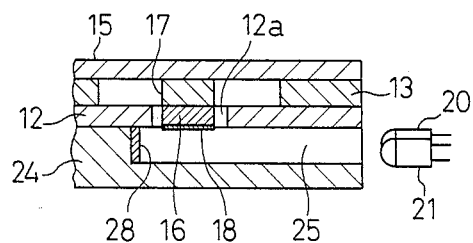
FIG. 10 is a view similar to FIG. 4 showing the photo-coupling switch device as a fifth embodiment.

FIG. 10 shows the photo-coupling switch device of a fifth embodiment. Identical parts are labelled by the same reference numerals as those in the second and fourth embodiments. A reflecting member 28 is provided on the inner end of the light passageway 25. The fluorescent substance 16 is positioned outside the light passageway 25 when the operating plate 15 is not depressed. When the operating plate 15 is depressed, the fluorescent substance 16 is displaced into the light passageway 25.

According to the arrangement of the fifth embodiment, when the operating plate is not depressed as shown in FIG. 10, the light intermittently emitted from the light-emitting diode 20 is reflected on the reflecting member 28 to be detected by the phototransistor 21. When the operating plate 15 is depressed, the fluorescent substance 16 is displaced into the light pasageway 25. The light from the light-emitting diode 20 impinges on the fluorescent substance 16, which continuously fluoresces. The fluorescence continuously emitted from the fluorescent substance 16 is detected by the phototransistor 21. Thus, the switching signals are obtained in accordance with operation of the operating plate 15.

Although each of the light guiding members employed in the second and third embodiments is formed of a hollow material, a solid material may be employed. In the second embodiment, particularly, when a half mirror is provided on the inner peripheral surface 11c for allowing part of the light impinging thereon to pass therethrough, the light guiding member may be formed of a hollow material.

The foregoing disclosure and drawings are merely illustrative of the principles of the present invention and are not interpreted in a limiting sense. The only limitation is to be determined from the scope of the appended claims.

What is claimed is:
1. A photo-coupler for pulse circuits comprising:
  (a) a case formed of a non-transparent material;
  (b) a fluorescent substance provided in said case, said fluorescent substance having opposite first and second sides, said fluorescent substance emitting a fluorescence when a light impinges thereon and emitting a phosphorescence after the impingement of the light is interrupted, the amount of phosphorescence emitted being reduced with the elapsing of time; and
  (c) a light emitting element and a light receiving element both provided in said case so as to be placed in an opposite relation with each other, the light emitting element being positioned adjacent to the first side and the light receiving element being positioned adjacent to the second side of the said fluorescent substance, the light emitting element and the light receiving element being mechanically combined with said case and said fluorescent substance so as to form an individual solid-state device as a whole, said light emitting element being provided with an input terminal to which electrical pulses are supplied so that photo pulses are generated, said light receiving element being provided with an output terminal at which an electrical signal is produced, the level of which electrical signal is varied in accordance with the amount of the receiving light.

2. A photo-coupler for pulse circuits according to claim 1, wherein said first and second sides of the fluorescent substance are formed with respective first and second recesses and wherein said light emitting element and said light receiving element are respectively positioned within the first and second recesses substantially integral with said fluorescent substance.

3. A photo-coupler for pulse circuits according to claim 2, and a light transmitting substance embedding the light emitting element and the light receiving element, the light transmitting substance being an extended part of said fluorescent substance.

4. A photo-coupler for pulse circuits according to claim 2 and a molded member within the case and covering the fluorescent substance, the light emitting element and the light receiving element, the molded member shielding the components from contact by ambient light from outside of the case.

5. A photo-delay coupler comprising:
  (a) a first input terminal comprising a light source for emitting a light when activated;
  (b) a second output terminal comprising a light detector for detecting the light emitting by the light source; and
  (c) a means to delay the detection of the light, the means to delay comprising a fluorescent substance onto which the light emitted from said light source impinges said fluorescent substance, the fluorescent substance firstly emitting a fluorescence while the light emitted from said light source is impinging thereon and secondly emitting a phosphorescence after emissing of light from said light source is interrupted, the said light source and the said light detector being embedded in the said fluorescent substance;

whereby the phosphorescence emitted by the fluorescent substance after interruption of light from the light source delays the light detecting period of operation of the light detector.

* * * * *